US012740016B2

(12) United States Patent
Tsang et al.

(10) Patent No.: US 12,740,016 B2
(45) Date of Patent: Sep. 15, 2026

(54) TWO-PHASE LIQUID COOLING SYSTEM, TWO-PHASE LIQUID COOLING CABINET, AND METHOD FOR LIQUID COOLING OF ELECTRONIC DEVICES

(71) Applicant: Fulian Precision Electronics (Tianjin) Co., LTD., Tianjin (CN)

(72) Inventors: Sung Tsang, New Taipei (TW); Tsung-Lin Liu, Neihu (TW); Yu-Chia Ting, Neihu (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 429 days.

(21) Appl. No.: 18/229,197

(22) Filed: Aug. 2, 2023

(65) Prior Publication Data

US 2024/0341062 A1 Oct. 10, 2024

(30) Foreign Application Priority Data

Apr. 6, 2023 (CN) ........................ 202310362672.6

(51) Int. Cl.
*H05K 7/20* (2006.01)

(52) U.S. Cl.
CPC ....... *H05K 7/20327* (2013.01); *H05K 7/2039* (2013.01); *H05K 7/20818* (2013.01)

(58) Field of Classification Search
CPC ............. H05K 7/20327; H05K 7/2039; H05K 7/20818; H05K 7/20809; H05K 7/20709; H05K 7/208; H05K 7/20836
See application file for complete search history.

(56) References Cited

U.S. PATENT DOCUMENTS 5,711,155 A * 1/1998 DeVilbiss ............... F25B 21/02 62/434
8,035,972 B2 * 10/2011 Ostwald ............. H05K 7/20645 165/80.4

(Continued)

FOREIGN PATENT DOCUMENTS

CN 101346056 A * 1/2009 ........... H01L 23/427
CN 101617281 12/2009

(Continued)

OTHER PUBLICATIONS

Ball Valves vs. Needle Valves for Flow Control, Sep. 21, 2021, retrieved from—https://web.archive.org/web/20210921011815/https://www.unifiedalloys.com/blog/ball-valves-vs-needle-valves/, 7 pages (Year: 2021).*

*Primary Examiner* — Yongjia Pan
(74) *Attorney, Agent, or Firm* — ScienBiziP, P.C.

(57) ABSTRACT

A two-phase liquid cooling system for cooling electronic devices includes a housing configured for accommodating the electronic devices, a cooling loop connected to the housing, and an impedance device connected to the cooling loop. The cooling loop includes a supply manifold, a return manifold, and multiple cooling branches connected in parallel between the supply manifold and the return manifold, each cooling branch is configured for transferring cooling liquid to cool one electronic device. The impedance device increases impedance in each of the multiple cooling branches to reduce difference in impedance between each cooling branch and balances the pressure drop in each cooling branch, and thus balancing the cooling liquid flow rate in each cooling branch. A two-phase liquid cooling cabinet and method for liquid cooling of multiple electronic devices with different thermal loads are also disclosed.

13 Claims, 17 Drawing Sheets

(56) References Cited

U.S. PATENT DOCUMENTS 9,529,395 B2 * 12/2016 Franz .................. H05K 7/20772
11,297,741 B2 * 4/2022 Gao ..................... H05K 7/2079
11,516,944 B1 * 11/2022 Gao ....................... H05K 7/208
2003/0217558 A1 * 11/2003 Wall ...................... F25B 41/347 62/223
2005/0122685 A1 * 6/2005 Chu ..................... H05K 7/2079 361/689
2005/0244280 A1 * 11/2005 Malone ................. F04B 19/006 257/E23.098
2006/0126296 A1 * 6/2006 Campbell ............ H05K 7/2079 361/700
2007/0201204 A1 * 8/2007 Upadhya ............ H05K 7/20727 361/695
2007/0213881 A1 * 9/2007 Belady ................... G05D 23/19 361/679.48
2007/0297136 A1 * 12/2007 Konshak ............ H05K 7/20781 361/699
2008/0156462 A1 * 7/2008 Arik ...................... F04D 29/582 257/E23.098
2011/0056225 A1 * 3/2011 Campbell .......... H05K 7/20381 62/223
2011/0060470 A1 * 3/2011 Campbell .......... G05D 23/1934 700/282
2012/0113584 A1 * 5/2012 Chen .................. H05K 7/20781 361/679.47
2015/0189796 A1 * 7/2015 Shedd ..................... F28F 13/06 165/104.31
2021/0400840 A1 * 12/2021 Shao .................. H05K 7/20781
2022/0408607 A1 * 12/2022 Gao ................... H05K 7/20318
2023/0200027 A1 * 6/2023 Gao ................... H05K 7/20327 361/689
2023/0240053 A1 * 7/2023 Turner ............... H05K 7/20281
2023/0276602 A1 * 8/2023 Gao ................... H05K 7/20818 361/679.02
2023/0280228 A1 * 9/2023 Ting .......................... G06F 1/20 700/282

FOREIGN PATENT DOCUMENTS

CN 108770297 11/2018
CN 114600056 6/2022
CN 115377778 A 11/2022
CN 218172016 12/2022
CN 113727574 B * 4/2025 ......... H05K 7/20781
DE 102014220387 A1 * 4/2016 ................ F01P 7/16

* cited by examiner

TWO-PHASE LIQUID COOLING SYSTEM, TWO-PHASE LIQUID COOLING CABINET, AND METHOD FOR LIQUID COOLING OF ELECTRONIC DEVICES

CROSS-REFERENCE TO RELATED APPLICATION

This application claims priority to China Application No. 202310362672.6, having a filing date of Apr. 6, 2023, filed in China State Intellectual Property Administration, the entire contents of which are hereby incorporate by reference.

FIELD

The subject matter herein generally relates to heat dissipation technologies, and more particularly to a two-phase liquid cooling system, a two-phase liquid cooling cabinet, and a method for liquid cooling of electronic devices.

BACKGROUND

In modern server systems, heat dissipation has become an increasingly important issue. Currently, technology has been developed to immerse the entire server in cooling liquid and circulate it for cooling. In use, liquid cooling systems typically involve the cooling of multiple servers, which means that when servers have different power loads (thermal design power, TDP), the amount of cooling liquid that undergoes boiling/phase change varies as it flows through each server. As a result, the flow rate of the cooling liquid in each server becomes unbalanced, leading to different pressure drops on each server. For example, in a high heat generation server loop, more phase change occurs in the cooling liquid, producing more steam, resulting in higher pressure drops and insufficient cooling liquid flow. Unbalanced cooling liquid flow rates can lead to poor control of the cooling performance of each server. For example, in the absence of sufficient cooling liquid flow rates, the chip temperature of the server may be higher, and may even cause chip overheating or damage.

Therefore, there is room for improvement within the art.

DETAILED DESCRIPTION

Figure 1:
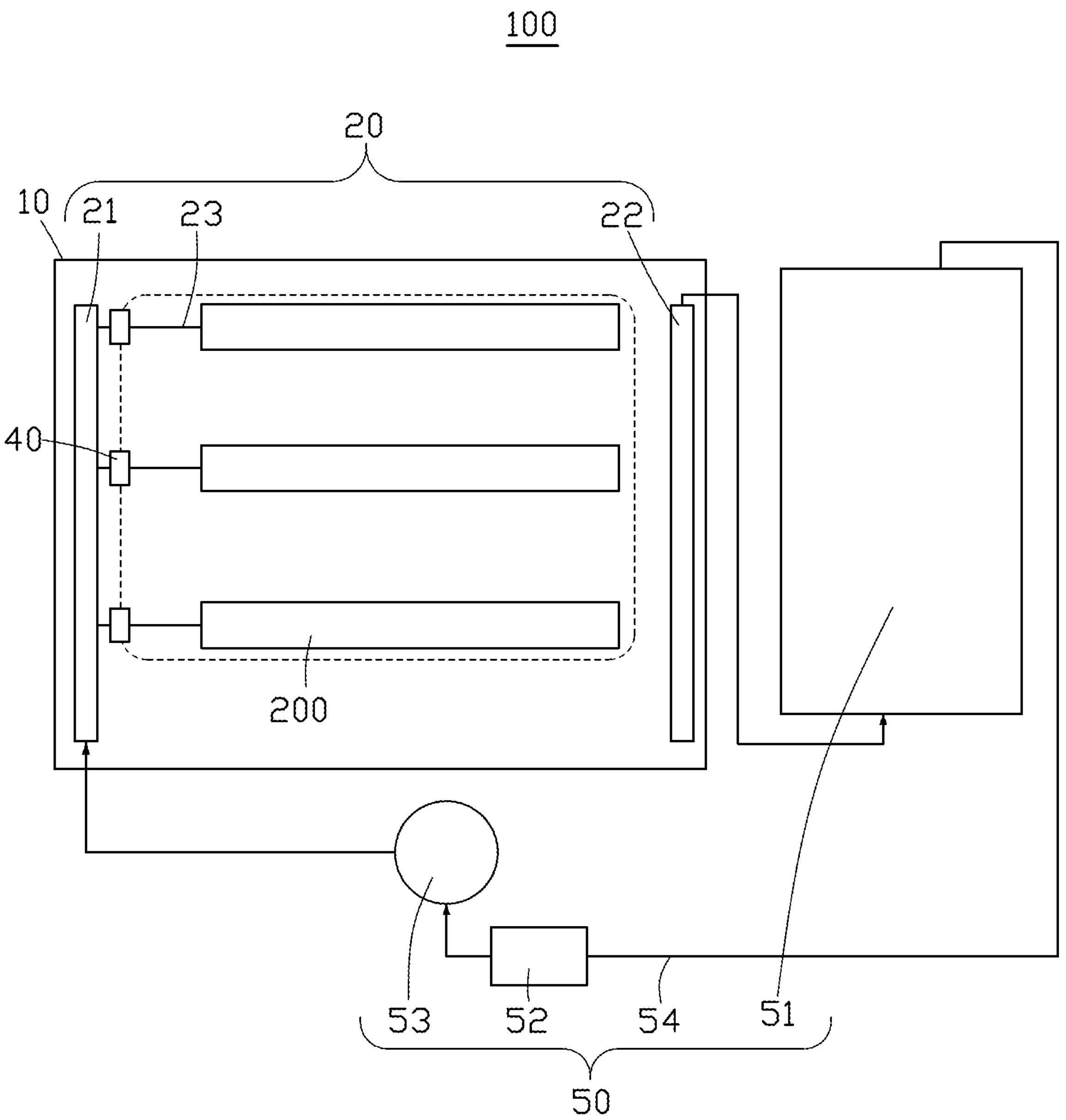
FIG. 1 is a schematic diagram of a two-phase liquid cooling system according to an embodiment of the disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

FIG. 1 illustrates a two-phase liquid cooling system 100 for cooling electronic devices 200. The two-phase liquid cooling system 100 includes a housing 10, a cooling loop 20, and an impedance device 40. The housing 10 is used to accommodate the electronic devices 200. The cooling loop 20 includes a supply manifold 21, a return manifold 22, and multiple cooling branches 23 connected in parallel between the supply manifold 21 and the return manifold 22. Each cooling branch 23 is used to cool one electronic device 200. The impedance device 40 is connected to the cooling loop 20 and is used to increase the impedance in each cooling branch 23 to adjust and balance the cooling liquid flow rate in each cooling branch 23.

In operation, since each electronic equipment 200 has a different power load, the amount of cooling liquid that undergoes boiling/phase change when flowing through each electronic equipment 200 is not equal, which leads to an imbalance in the cooling liquid flow rate through each electronic equipment 200. The two-phase liquid cooling system 100 uses the impedance device 40 to increase the impedance in each cooling branch 23, which reduce the difference in impedance between each cooling branch 23 and balances the pressure drop in each cooling branch 23, and thus balancing the cooling liquid flow rate in each cooling branch 23. The two-phase liquid cooling system 100 improves the cooling efficiency, avoids the pressure in the cooling branch 23 corresponding to electronic device 200 with high thermal load from rising too much compared to other cooling branches 23 due to excessive fluid evaporation, and prevents the cooling liquid flow rate from being unable to be smoothly guided into the cooling branch 23 corresponding to that electronic device 200.

For example, the multiple electronic devices include one high thermal load electronic device, and the pressure drop in the cooling branch of the high thermal load electronic device can reach 8 psi, and the pressure drop in other cooling branches vary between 5 psi and 8 psi. Then the pressure drop difference ratio between each cooling branch is 8/5=1.6. The impedance device increases the impedance in each cooling branch by about 10 psi, so that the pressure drop difference ratio is reduced to 18/15=1.2. i.e., the pressure drop difference ratio is reduced from 1.6 to 1.2, thereby reducing the pressure drop difference between each cooling branch and achieving the goal of uniform pressure and improved cooling efficiency.

In further embodiments, the two-phase liquid cooling system 100 further includes a cooling liquid supply device 50. The cooling liquid supply device 50 includes a radiator 51, a cooling liquid reservoir 52, a cooling liquid pump 53, and a pipeline 54. The radiator 51, the cooling liquid reservoir 52, and the cooling liquid pump 53 are connected in sequence by the pipeline 54. The cooling liquid supply device 50 is located outside the housing 10 and is connected to the cooling loop 20.

Figure 2:
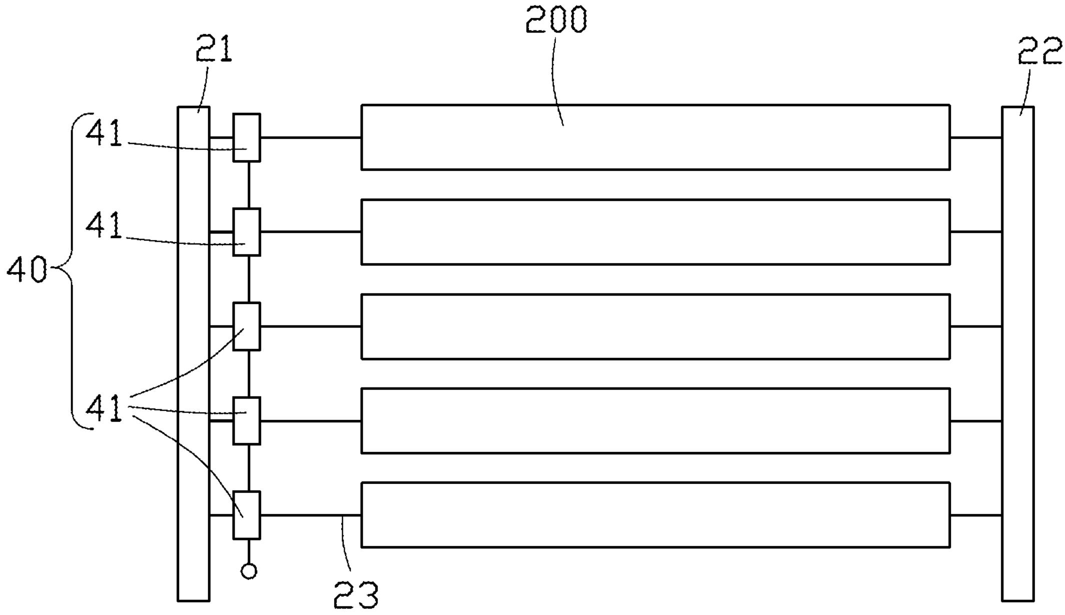
FIG. 2 is a schematic diagram of cooling circuit of the two-phase liquid cooling system shown in FIG. 1.

In further embodiments, as shown in FIG. 2, the impedance device 40 includes multiple ball valves 41 integrated in the supply manifold 21. Each ball valve 41 increases the impedance of one cooling branch 23.

Figure 3:
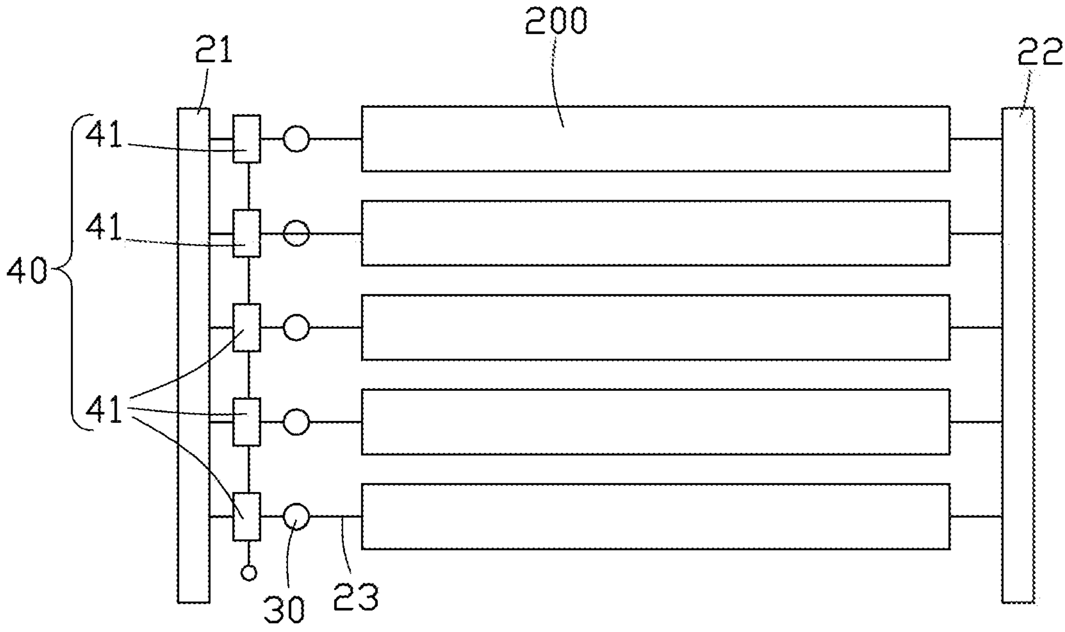
FIG. 3 is a schematic diagram of the cooling circuit of a two-phase liquid cooling system according to another embodiment in the disclosure.

Alternatively, as shown in FIG. 3, each of the multiple ball valves 41 is installed in one cooling branch 23 to increase the impedance of the one cooling branch 23.

Therefore, according to actual needs, the impedance device 40 can be integrated in the supply manifold 21 or separately installed in each cooling branch 23.

In this embodiment, the impedance device 40 is implemented as ball valves 41. In practice, the impedance of the cooling branches 23 can be increased by adjusting the opening of the ball valve to change the fluid channel diameter. In other embodiments, the impedance device 40 can also be implemented as capillary tubes, which is high-impedance components. By adjusting length of the capillary tube, the impedance of the cooling liquid in the cooling branch 23 can be changed.

Figure 4:
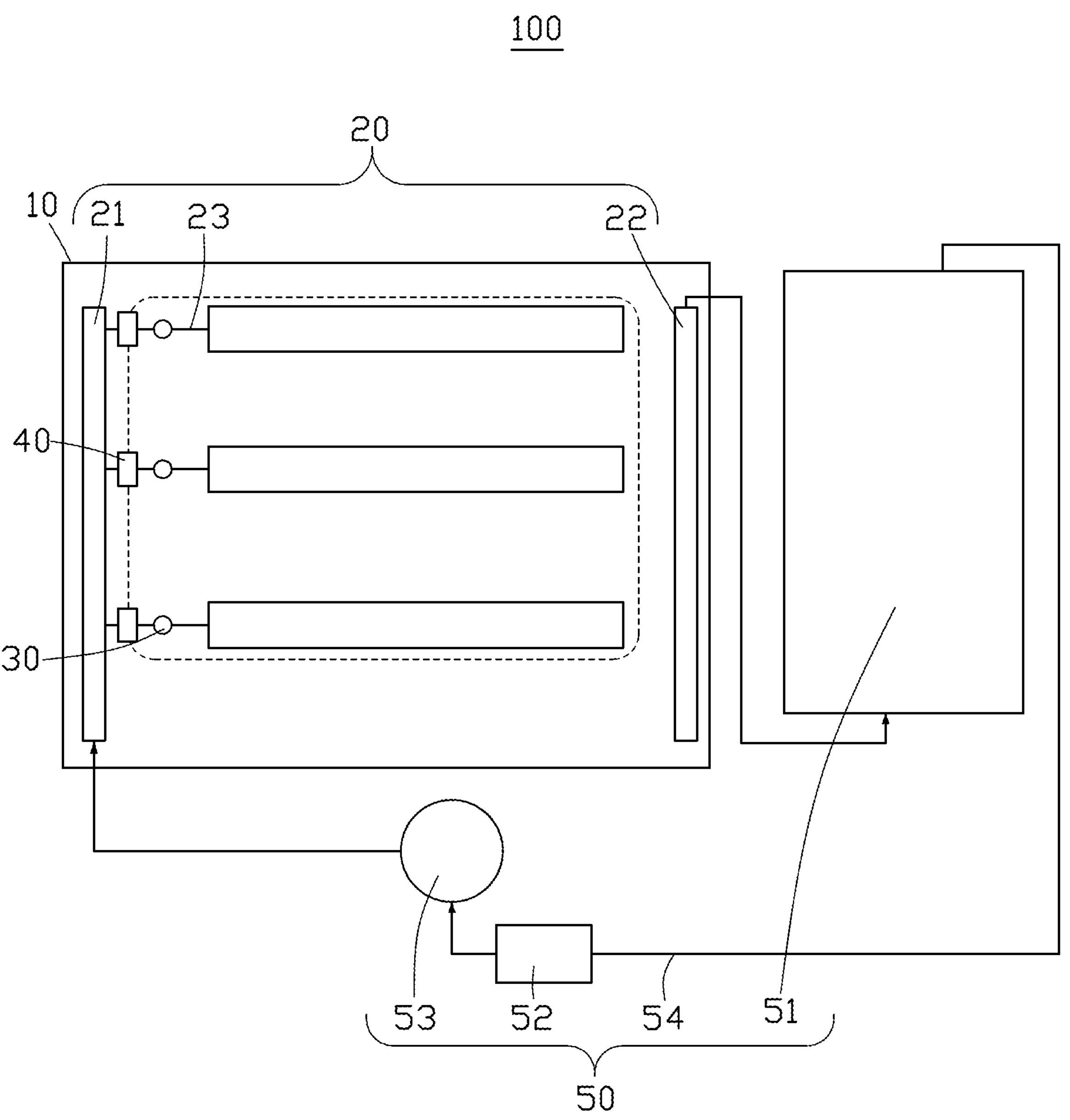
FIG. 4 is a schematic diagram of a two-phase liquid cooling system according to still another embodiment of the disclosure.

FIG. 4 illustrates a two-phase liquid cooling system 100 including multiple impedance sensing devices 30, each impedance sensing device 30 is connected to one cooling branch 23 of the cooling loop 20 to measure the impedance of the cooling liquid in the one cooling branch 23. For each cooling branch 23, the impedance device 40 is connected to the impedance sensing device 23, and the impedance device 40 is configured for regulating the impedance in each cooling branch 23 based on measuring result obtained by the impedance sensing device 30.

In operation, the impedance sensing devices 30 measure the impedance of the cooling liquid in each cooling branch 23, and the impedance devices 40 adjust the impedance of the cooling liquid in each cooling branch 23 based on the measuring results obtained by the impedance sensing device 30, thereby reducing the difference in impedance between the cooling liquid in each cooling branch 23, balancing the pressure drop in each cooling branch 23, balancing the cooling liquid flow rate of the cooling liquid in each cooling branch 23, and avoiding the situation where the pressure in the cooling branch 23 corresponding to the electronic device 200 with high thermal load increases too much compared to other cooling branches 23 due to excessive fluid evaporation, and leads to the inability to smoothly guide the cooling liquid flow into the cooling branch 23 corresponding to the electronic device 200 with high thermal load.

Figure 5:
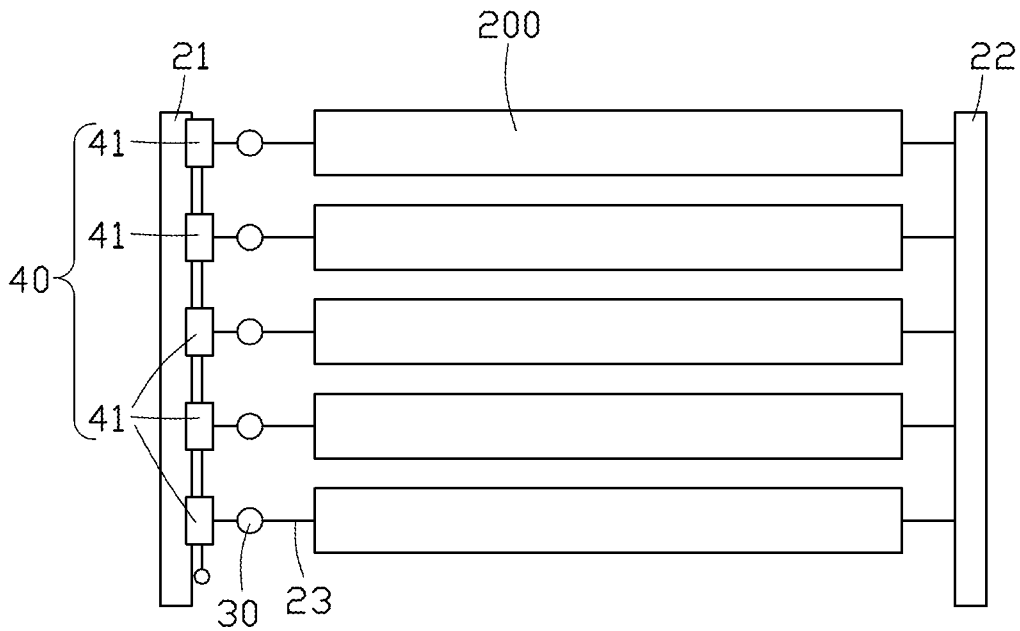
FIG. 5 is a schematic diagram of cooling circuit of the two-phase liquid cooling system shown in FIG. 4.

In FIG. 5, according to further embodiments, the impedance sensing devices 30 are provided in each cooling branch 23, the impedance devices 40 implemented as multiple ball valves 41 are integrated in the supply manifold 21, and each ball valve 41 is used to regulate the impedance of a respective cooling branch 23. It should be noted that, in other embodiments, each ball valve 41 can also be provided in one cooling branch 23 to regulate the impedance of the corresponding cooling branch 23.

Figure 6:
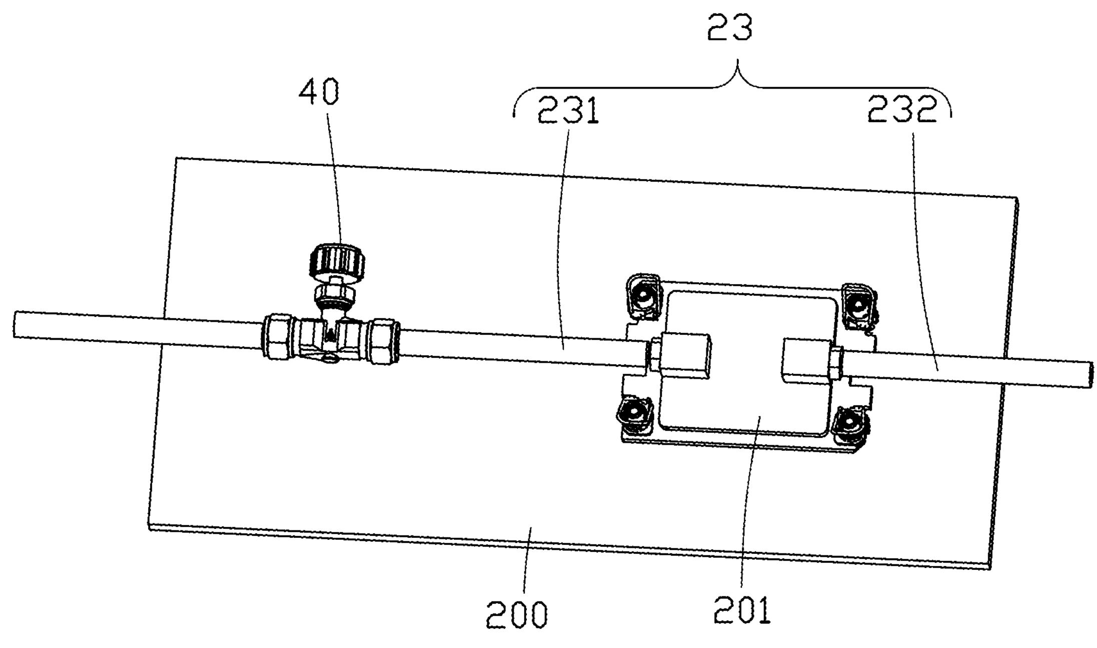
FIG. 6 is a schematic diagram of electronic devices of the two-phase liquid cooling system according to an embodiment of the disclosure.
Figure 7:
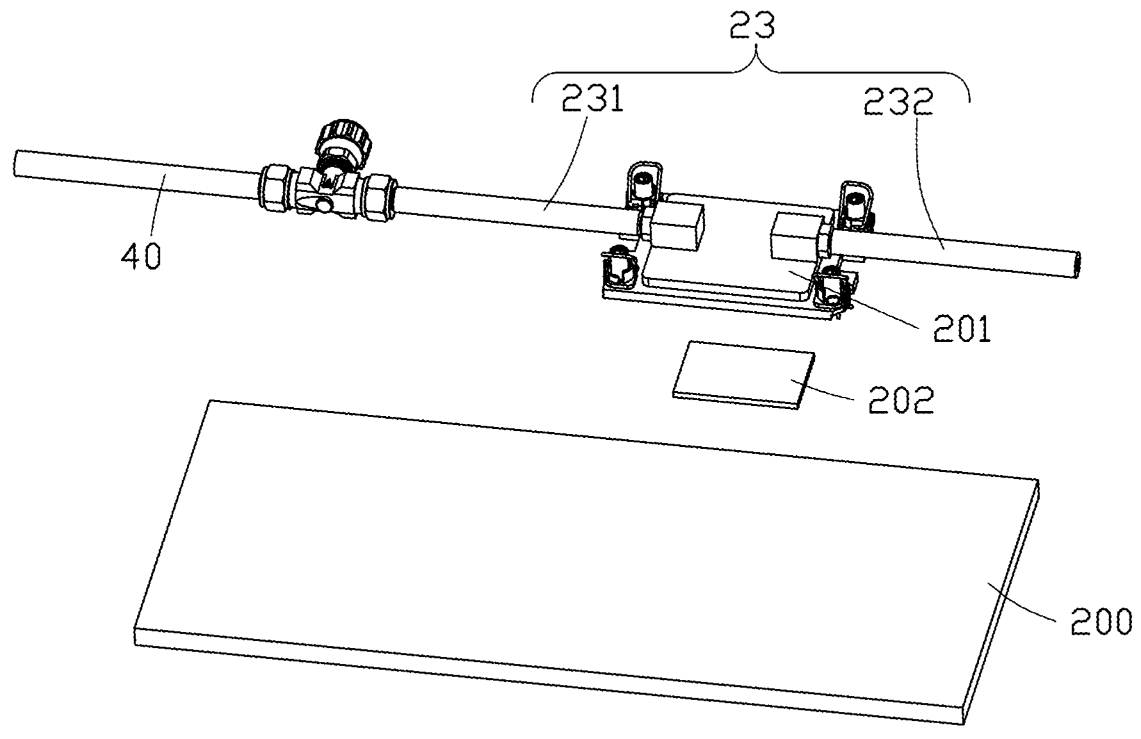
FIG. 7 is an exploded view of the electronic device in FIG. 6.

In other embodiments, as shown in FIG. 6 and FIG. 7, a heat dissipation plate 201 is provided on a heat generating element 202 of the electronic device 200, and the heat dissipation plate 201 is connected to the cooling circuit 20 (as shown in FIG. 1) via the cooling branch 23. In this way, the cooling liquid in the cooling branch 23 exchanges heat with the heat generating element 202 via the heat dissipation plate 201, taking away the heat generated by the heat generating element 202.

According to further embodiments, the cooling branch 23 includes a first branch pipe 231 connected between the supply manifold 21 and the heat dissipation plate 201, and a second branch pipe 232 connected between the heat dissipation plate 201 and the return manifold 22. In the illustrated embodiment, the impedance device 40 is provided on the first branch pipe 231, it should be understood that in other embodiments, the impedance device 40 can also be provided on the second branch pipe 232.

Figure 8:
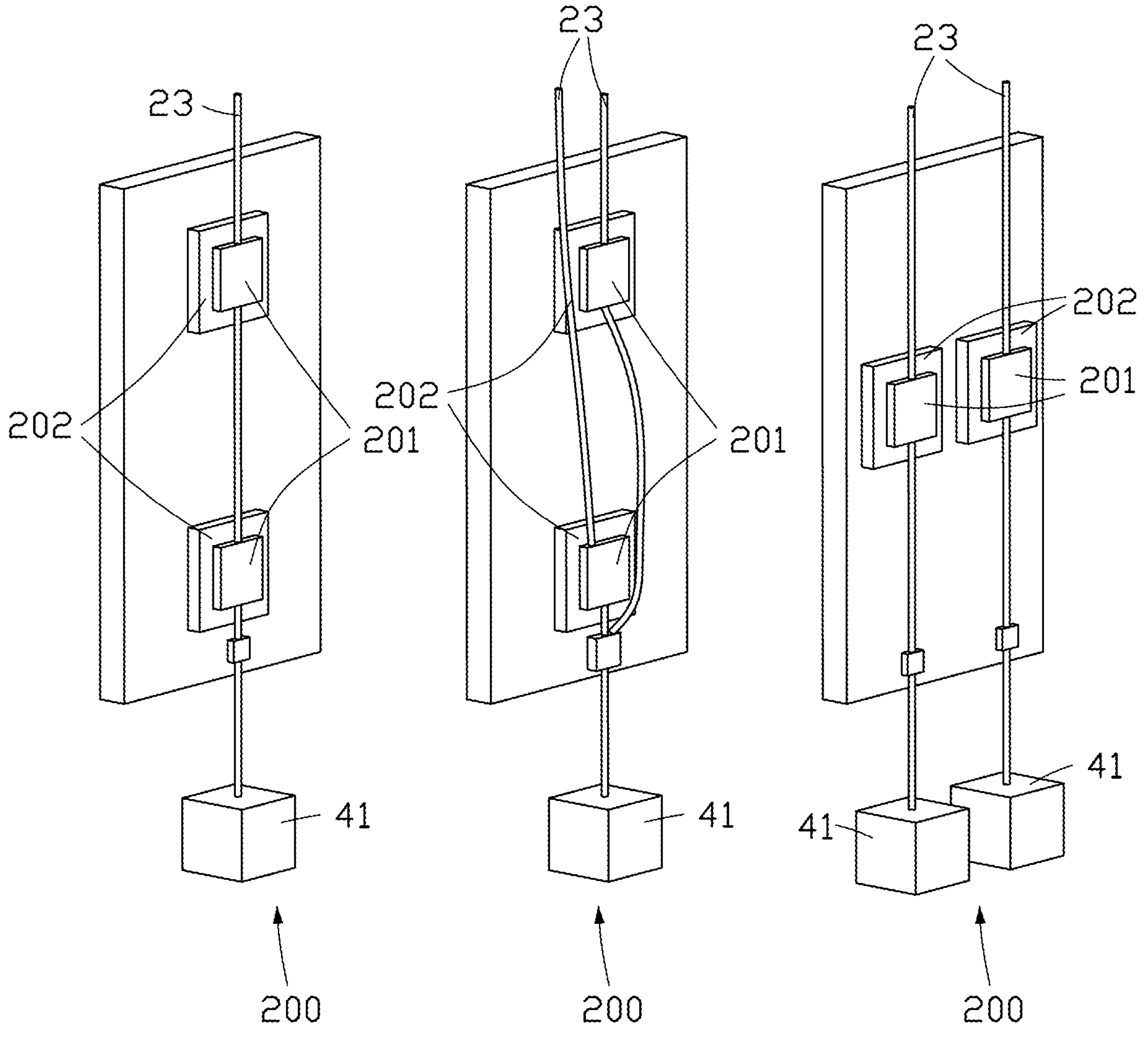
FIG. 8 is a schematic diagram of different arrangements of heat-generating components on the electronic device in FIG. 6.

In other embodiments, as shown in FIG. 8, the electronic device 200 may have multiple heat generating elements 202, each of which is provided with a heat dissipation plate 201, and multiple heat dissipation plates 201 in the electronic device 200 are connected in parallel or in series via the cooling branch 23. By providing a heat dissipation plate 201 on each heat generating element 202 of the electronic device 200, the heat dissipation efficiency of the two-phase liquid cooling system 100 can be improved. By connecting the heat dissipation plates 201 in parallel or in series according to the different requirements of each electronic device 200, the flexibility of the two-phase liquid cooling system 100 is increased, and the applicability of the two-phase liquid cooling system 100 is expanded.

Figure 9:
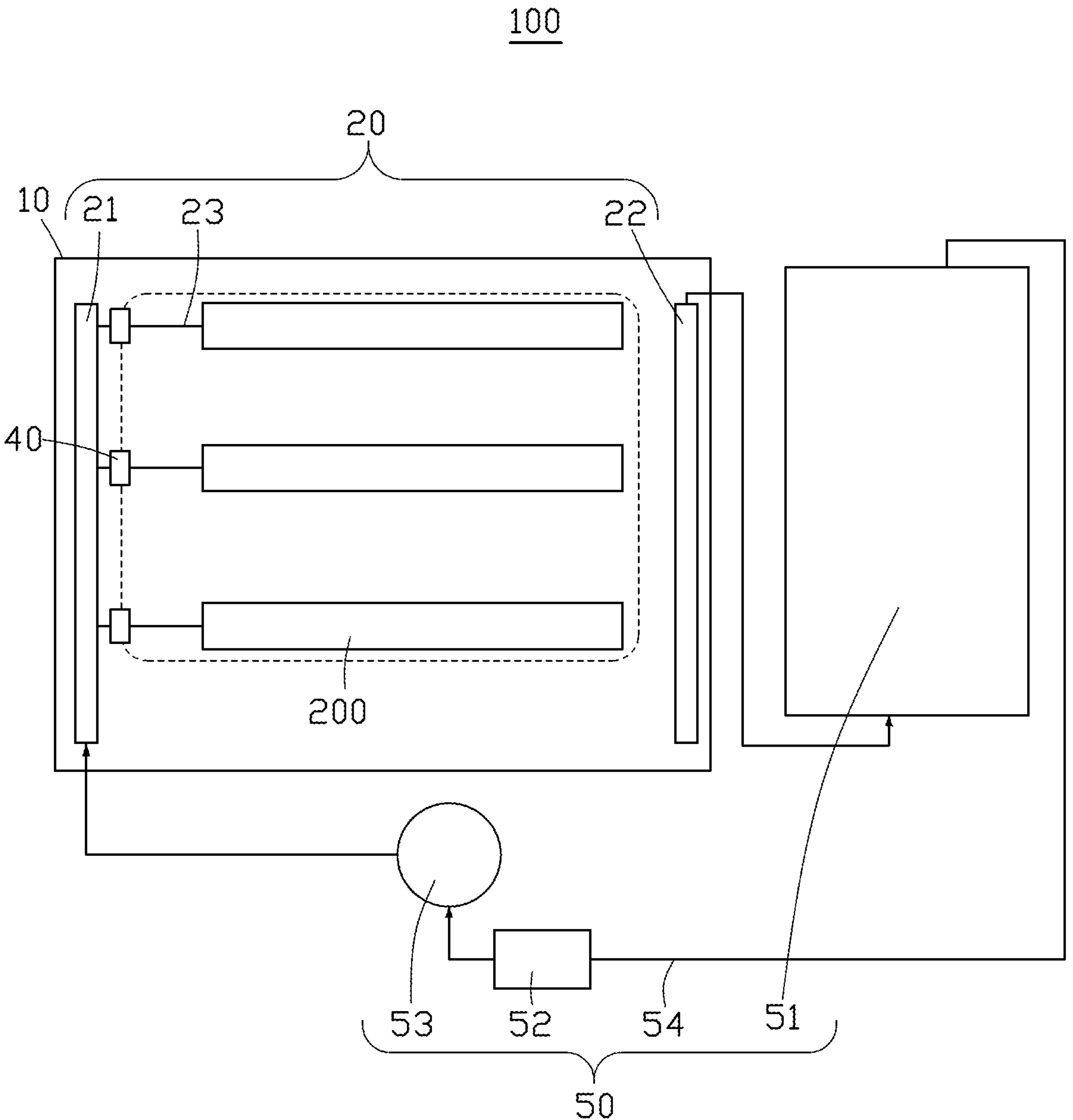
FIG. 9 is a schematic diagram of a two-phase liquid cooling cabinet according to an embodiment of the disclosure.

According to another aspect of the present disclosure, referring to FIG. 9, a two-phase liquid cooling cabinet 100 is provided. The two-phase liquid cooling cabinet 100 includes a housing 10, a cooling loop 20, and an impedance device 40. The housing 10 is used to accommodate multiple electronic devices 200. The cooling loop 20 includes a supply manifold 21, a return manifold 22, and multiple cooling branches 23 connected in parallel between the supply manifold 21 and the return manifold 22. Each cooling branch 23 is used to cool one electronic device 200. The impedance device 40 is connected to the cooling loop 20 and is used to increase the impedance in each cooling branch 23 to adjust and balance the cooling liquid flow rate in each cooling branch 23.

In further embodiments, the two-phase liquid cooling system 100 further includes a cooling liquid supply device 50. The cooling liquid supply device 50 includes a radiator 51, a cooling liquid reservoir 52, a cooling liquid pump 53, and a pipeline 54. The radiator 51, the cooling liquid reservoir 52, and the cooling liquid pump 53 are connected in sequence by the pipeline 54. The cooling liquid supply device 50 is located outside the housing 10 and is connected to the cooling loop 20.

Figure 10:
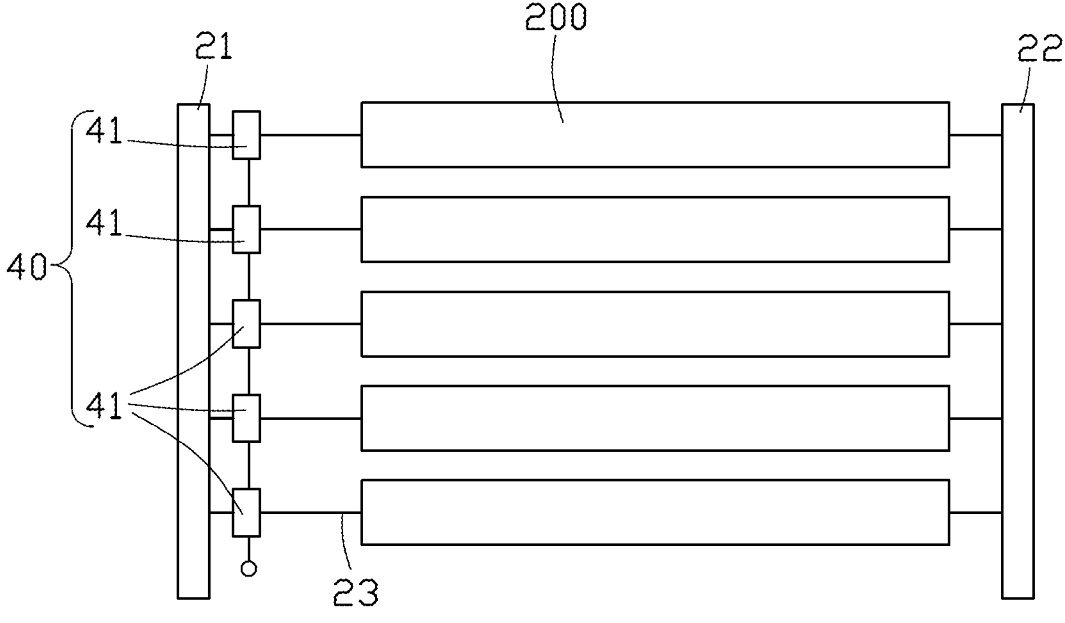
FIG. 10 is a schematic diagram of cooling circuit of the two-phase liquid cooling cabinet shown in FIG. 9.

In further embodiments, as shown in FIG. 10, the impedance device 40 includes multiple ball valves 41 integrated in the supply manifold 21. Each ball valve 41 increases the impedance of one cooling branch 23.

Figure 11:
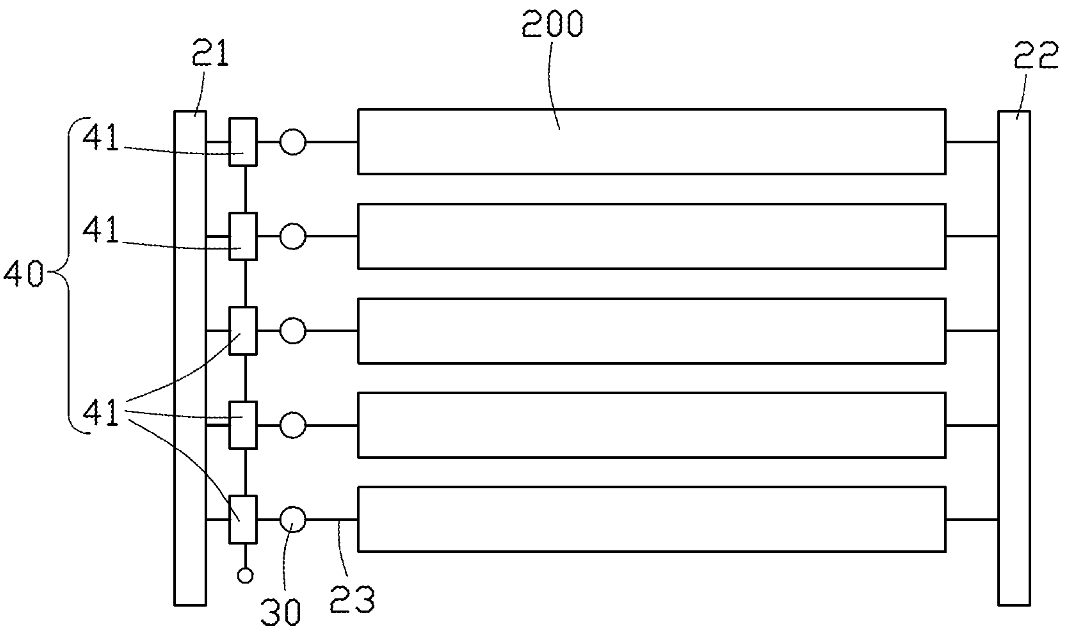
FIG. 11 is a schematic diagram of the cooling circuit of a two-phase liquid cooling cabinet according to another embodiment in the disclosure.

Alternatively, as shown in FIG. 11, each of the multiple ball valves 41 is installed in one cooling branch 23 to increase the impedance of the one cooling branch 23.

Therefore, according to actual needs, the impedance device 40 can be integrated in the supply manifold 21 or separately installed in each cooling branch 23.

In this embodiment, the impedance device 40 is implemented as ball valves 41. In practice, the impedance of the cooling branches 23 can be increased by adjusting the opening of the ball valve to change the fluid channel diameter. In other embodiments, the impedance device 40 can also be implemented as capillary tubes, which is high-impedance components. By adjusting length of the capillary tube, the impedance of the cooling liquid in the cooling branch 23 can be changed.

Figure 12:
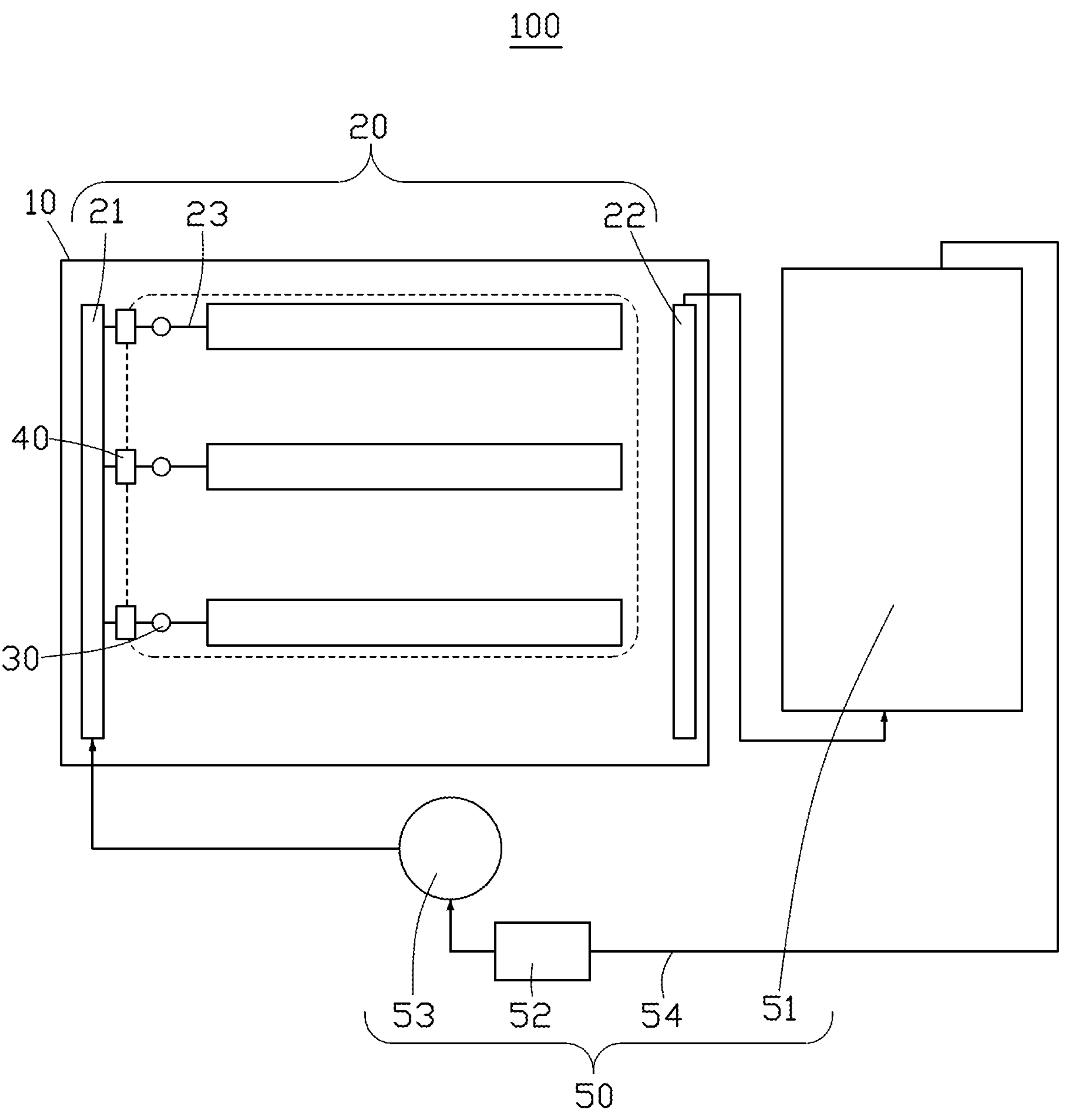
FIG. 12 is a schematic diagram of a two-phase liquid cooling cabinet according to still another embodiment of the disclosure.

FIG. 12 illustrates a two-phase liquid cooling system 100 including multiple impedance sensing devices 30, each impedance sensing device 30 is connected to one cooling branch 23 of the cooling loop 20 to measure the impedance of the cooling liquid in the one cooling branch 23. For each cooling branch 23, the impedance device 40 is connected to the impedance sensing device 23, and the impedance device 40 is configured for regulating the impedance in each cooling branch 23 based on measuring result obtained by the impedance sensing device 30.

In operation, the impedance sensing devices 30 measure the impedance of the cooling liquid in each cooling branch 23, and the impedance devices 40 adjust the impedance of the cooling liquid in each cooling branch 23 based on the measuring results obtained by the impedance sensing device 30, thereby reducing the difference in impedance between the cooling liquid in each cooling branch 23, balancing the pressure drop in each cooling branch 23, balancing the cooling liquid flow rate of the cooling liquid in each cooling branch 23, and avoiding the situation where the pressure in the cooling branch 23 corresponding to the electronic device 200 with high thermal load increases too much compared to other cooling branches 23 due to excessive fluid evaporation, and leads to the inability to smoothly guide the cooling liquid flow into the cooling branch 23 corresponding to the electronic device 200 with high thermal load.

Figure 13:
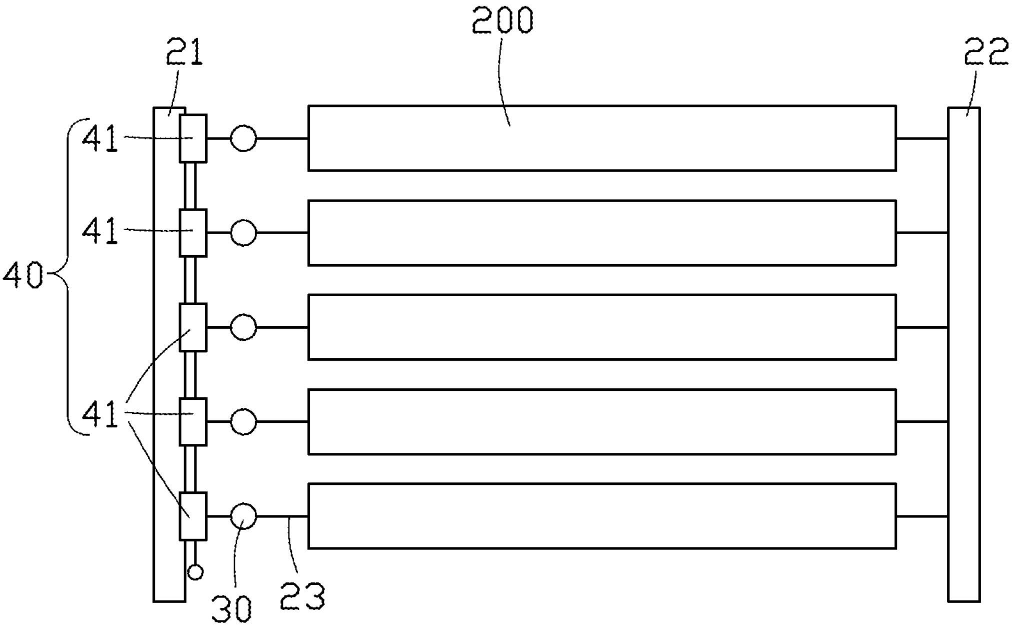
FIG. 13 is a schematic diagram of cooling circuit of the two-phase liquid cooling cabinet shown in FIG. 12.

In FIG. 13, according to further embodiments, the impedance sensing devices 30 are provided in each cooling branch 23, the impedance devices 40 implemented as multiple ball valves 41 are integrated in the supply manifold 21, and each ball valve 41 is used to regulate the impedance of a respective cooling branch 23. It should be noted that, in other embodiments, each ball valve 41 can also be provided in one cooling branch 23 to regulate the impedance of the corresponding cooling branch 23.

Figure 14:
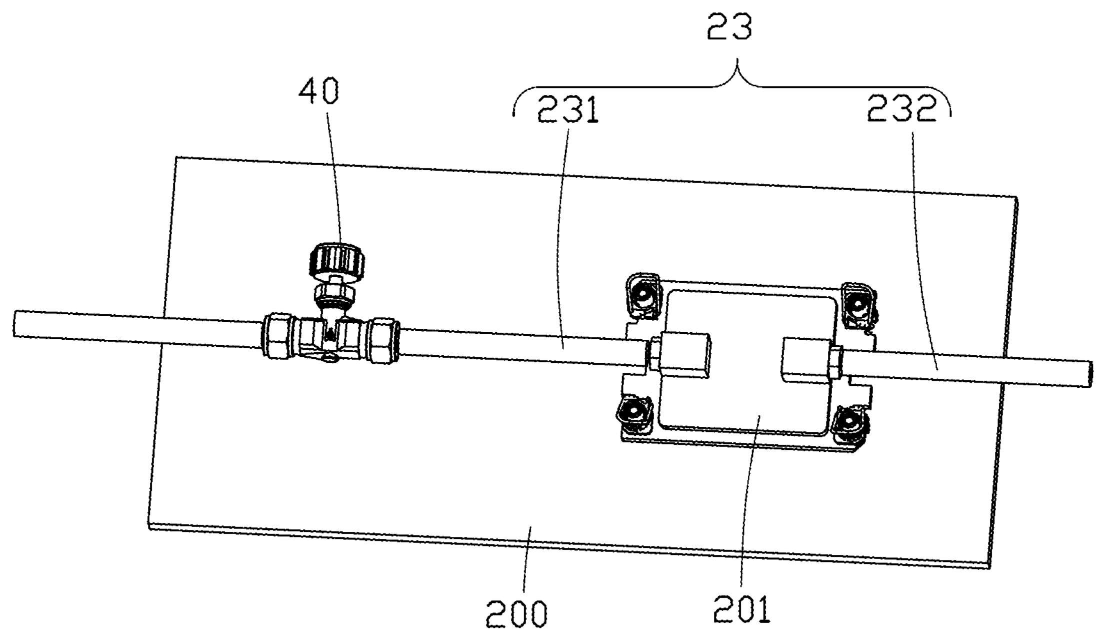
FIG. 14 is a schematic diagram of electronic devices of the two-phase liquid cooling cabinet according to an embodiment of the disclosure.
Figure 15:
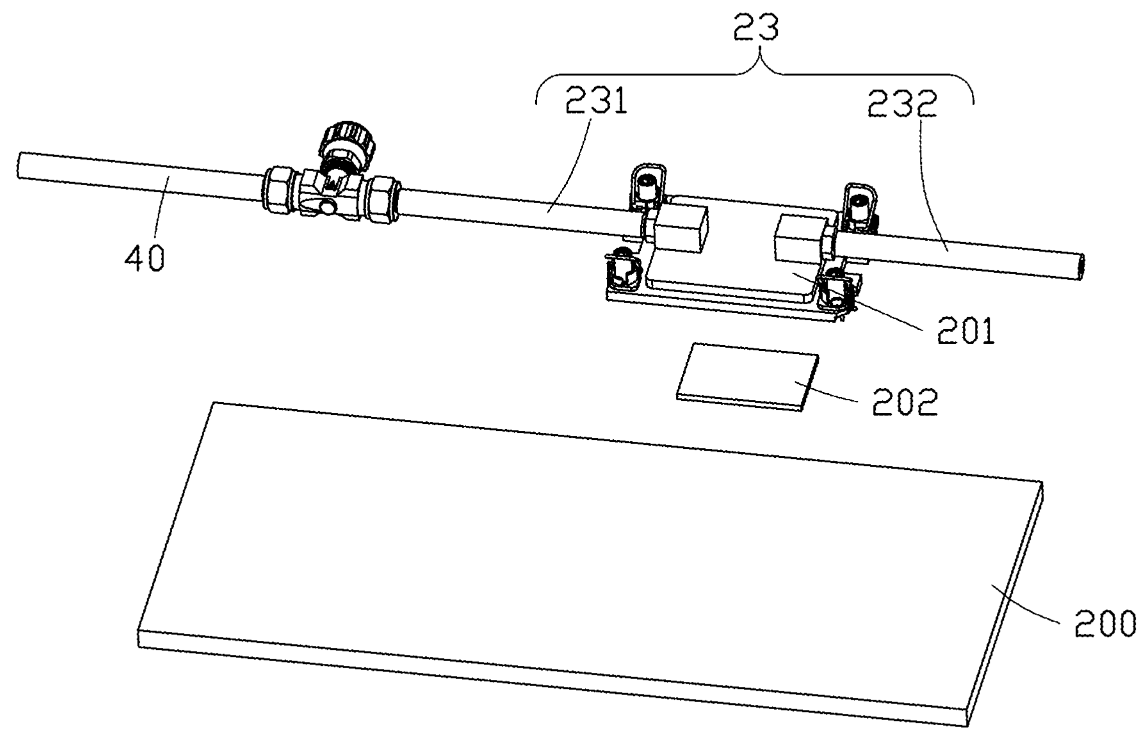
FIG. 15 is an exploded view of the two-phase liquid cooling cabinet in FIG. 14.

In other embodiments, as shown in FIG. 14 and FIG. 15, a heat dissipation plate 201 is provided on a heat generating element 202 of the electronic device 200, and the heat dissipation plate 201 is connected to the cooling circuit 20 (as shown in FIG. 9) via the cooling branch 23. In this way, the cooling liquid in the cooling branch 23 exchanges heat with the heat generating element 202 via the heat dissipation plate 201, taking away the heat generated by the heat generating element 202.

According to further embodiments, the cooling branch 23 includes a first branch pipe 231 connected between the supply manifold 21 and the heat dissipation plate 201, and a second branch pipe 232 connected between the heat dissipation plate 201 and the return manifold 22. In the illustrated embodiment, the impedance device 40 is provided on the first branch pipe 231, it should be understood that in other embodiments, the impedance device 40 can also be provided on the second branch pipe 232.

Figure 16:
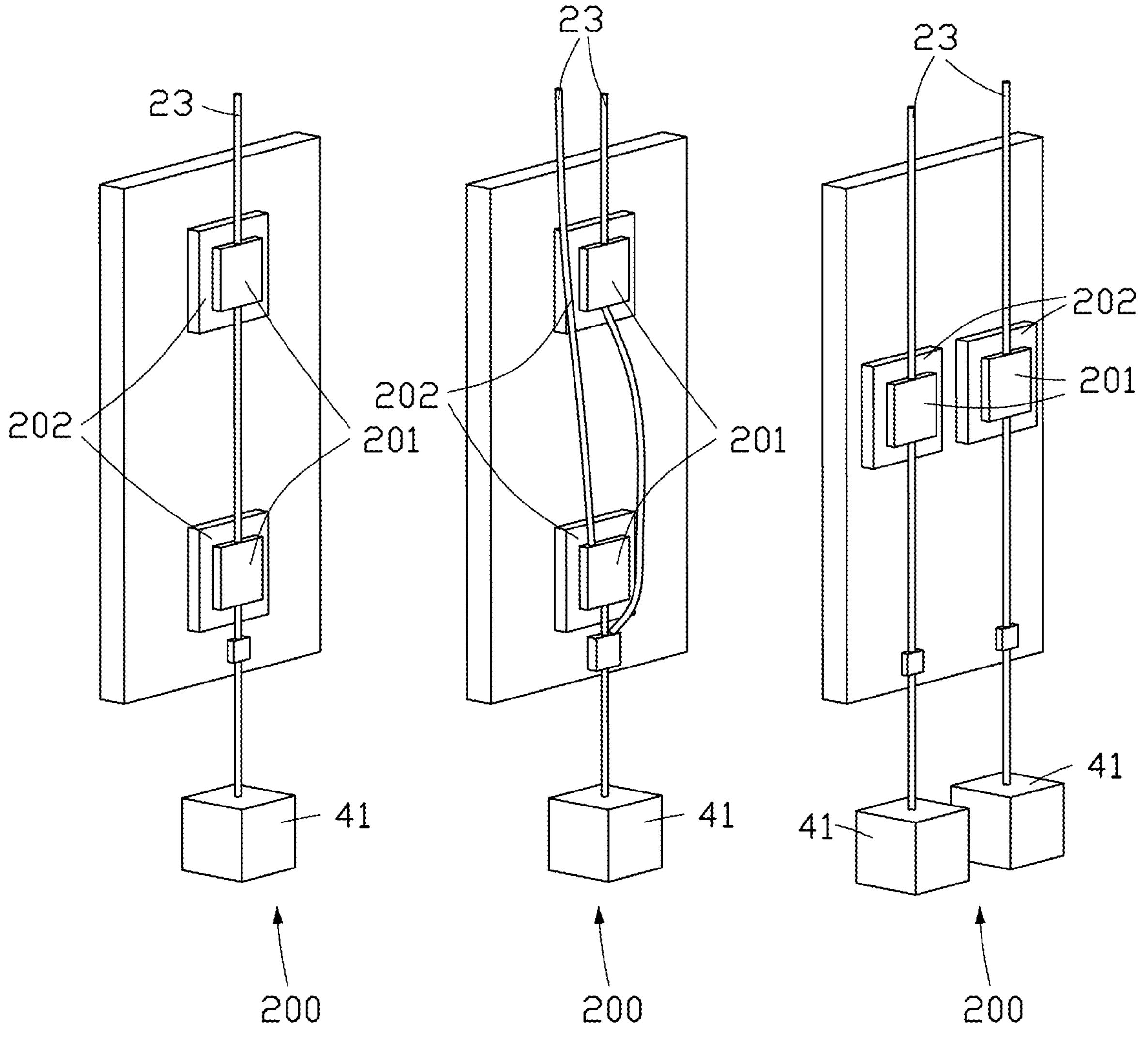
FIG. 16 is a schematic diagram of different arrangements of heat-generating components on the electronic device in FIG. 14.

In other embodiments, as shown in FIG. 16, the electronic device 200 may have multiple heat generating elements 202, each of which is provided with a heat dissipation plate 201, and multiple heat dissipation plates 201 in the electronic device 200 are connected in parallel or in series via the cooling branch 23. By providing a heat dissipation plate 201 on each heat generating element 202 of the electronic device 200, the heat dissipation efficiency of the two-phase liquid cooling system 100 can be improved. By connecting the heat dissipation plates 201 in parallel or in series according to the different requirements of each electronic device 200, the flexibility of the two-phase liquid cooling system 100 is increased, and the applicability of the two-phase liquid cooling system 100 is expanded.

Figure 17:
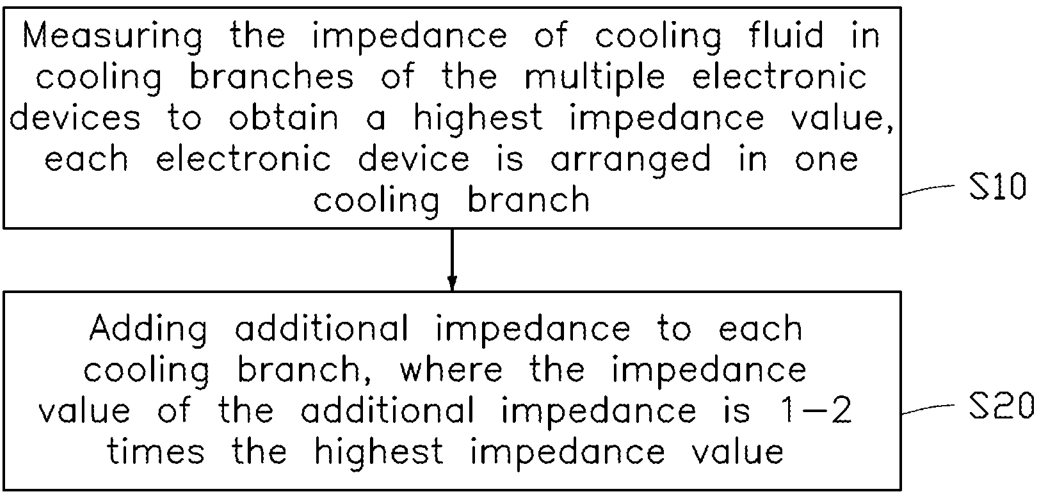
FIG. 17 is a flowchart of a method for liquid cooling of electronic devices according to an embodiment of the disclosure.

According to another aspect of the present disclosure, FIG. 17 illustrates a method for liquid cooling of electronic devices, the electronic devices include multiple electronic devices with different thermal loads. The method includes:

S10: Measuring the impedance of cooling fluid in cooling branches of the multiple electronic devices to obtain a highest impedance value, each electronic device is arranged in one cooling branch.

S20: Adding additional impedance to each cooling branch, where the impedance value of the additional impedance is 1-2 times the highest impedance value.

For example, the multiple electronic devices that are cooled by liquid cooling include a high thermal load electronic device, and the pressure drop in the circuit of the high thermal load electronic device can reach 8 psi (pounds per square inch). The pressure drops in the circuit of the multiple electronic devices range from 5 psi to 8 psi. At this point, the pressure drop ratio of the circuits of the multiple electronic devices is 8/5=1.6. Therefore, it is expected that the impedance device will set the additional impedance on each circuit at around 10 psi, then the pressure drop ratio of the circuits of the multiple electronic devices will be 18/15=1.2. This will reduce the pressure drop ratio from 1.6 to 1.2, thereby reducing the pressure drop difference between each circuit and achieving the goal of uniform pressure and improved heat dissipation efficiency.

Figure 18:
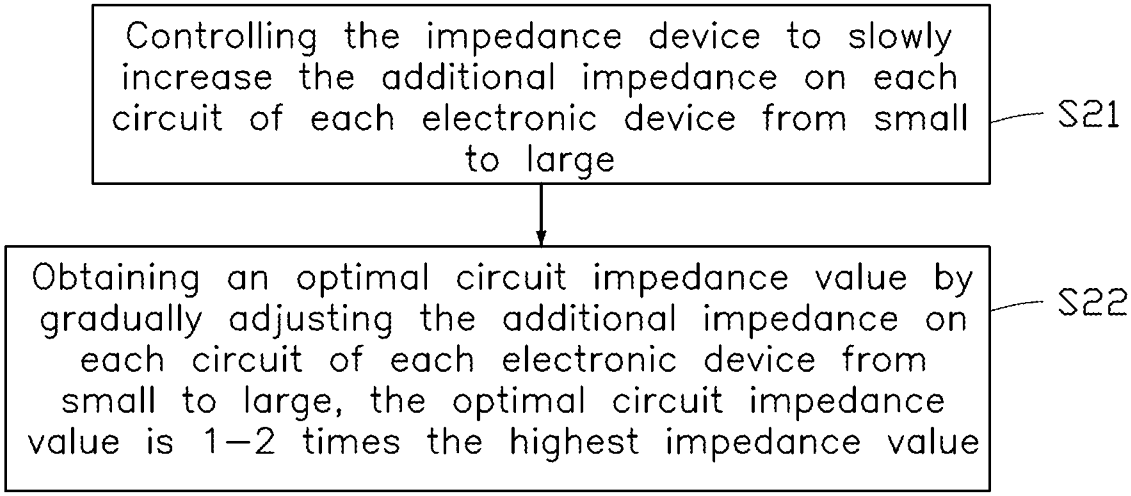
FIG. 18 is a flowchart of sub-steps of the step S20 in FIG. 17.

In other embodiments, referring to FIG. 18, an impedance device is provided on each circuit of each electronic device, and the step S20 further includes:

S21: Controlling the impedance device to slowly increase the additional impedance on each circuit of each electronic device from small to large.

S22: Obtaining an optimal circuit impedance value by gradually adjusting the additional impedance on each circuit of each electronic device from small to large, the optimal circuit impedance value is 1-2 times the highest impedance value.

In theory, continuously increasing the additional impedance can infinitely reduce the pressure drop difference between each circuit, but excessively high impedance will cause additional power consumption of the cooling liquid supply device, such as requiring the coolant pump to do more work to pump the coolant. In this embodiment, the optimal circuit impedance is determined by gradually increasing the additional impedance on each circuit from small to large, corresponding to the minimum impedance that is most suitable for the cooling effect, thus achieving a balance between cooling effect and energy consumption.

In other embodiments, additional impedance is set through a ball valve. Each cooling branch is provided with a ball valve, and the additional impedance of each cooling branch is increased by controlling the opening of each ball valve.

In other embodiments, additional impedance is set through a capillary tube. Each cooling branch is connected to a capillary tube, and additional impedance is increased by connecting a capillary tube with a predetermined length to each cooling branch.

The embodiments shown and described above are only examples. Many details are often found in the art. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A two-phase liquid cooling system for cooling electronic devices comprising:

a housing configured for accommodating the electronic devices;

a cooling loop connected to the housing, the cooling loop comprising a supply manifold, a return manifold, and multiple cooling branches connected in parallel between the supply manifold and the return manifold, each of the multiple cooling branches being configured for transferring cooling liquid to cool one of the electronic devices; and an impedance device connected to the cooling loop, and the impedance device increases impedance in each of the multiple cooling branches;

wherein the impedance device comprises multiple capillary tubes, each capillary tube of the multiple capillary tubes is installed in a respective cooling branch of the multiple cooling branches to increase the impedance in the respective cooling branch, and each capillary tube of the multiple capillary tubes has a predetermined length to further increase the impedance of the respective cooling branch.

2. The two-phase liquid cooling system of claim 1, wherein the impedance device comprises multiple ball valves integrated in the supply manifold, each of the multiple ball valves is configured for increasing the impedance in each of the multiple cooling branches.

3. The two-phase liquid cooling system of claim 1, wherein the impedance device comprises multiple ball valves, each of the multiple ball valves is installed in one of the multiple cooling branches to increase the impedance in each of the multiple cooling branches.

4. The two-phase liquid cooling system of claim 1, further comprising:

a cooling liquid supply device comprising a radiator, a cooling liquid reservoir, a cooling liquid pump, and a pipeline; the radiator, the cooling liquid reservoir, and the cooling liquid pump are connected in sequence by the pipeline.

5. The two-phase liquid cooling system of claim 4, wherein each of the multiple cooling branches comprises a heat dissipation plate provided on a heat generating element of the electronic device, and the cooling liquid in the cooling branches exchanges heat with the heat generating element via the heat dissipation plate.

6. The two-phase liquid cooling system of claim 1, further comprising:

multiple impedance sensing devices, each of the impedance sensing devices is connected to one of the multiple cooling branches to measure the impedance in each of the multiple cooling branches; the impedance device regulates the impedance in each of the multiple cooling branches according to measuring result obtained by the impedance sensing devices.

7. A two-phase liquid cooling cabinet comprising:

a housing accommodating multiple electronic devices with different thermal loads;

a cooling loop connected to the housing, the cooling loop comprising a supply manifold, a return manifold, and multiple cooling branches connected in parallel between the supply manifold and the return manifold, each of the multiple cooling branches is connected to one of the multiple electronic devices for transferring cooling liquid to the one of the multiple electronic devices; and an impedance device connected to the cooling loop, and the impedance device increases impedance in each of the multiple cooling branches;

wherein the impedance device comprises multiple capillary tubes, each capillary tube of the multiple capillary tubes is installed in a respective cooling branch of the multiple cooling branches to increase the impedance in the respective cooling branch, and each capillary tube of the multiple capillary tubes has a predetermined length to further increase the impedance of the respective cooling branch.

8. The two-phase liquid cooling cabinet of claim 7, wherein the impedance device comprises multiple ball valves integrated in the supply manifold, each of the multiple ball valves is configured for increasing the impedance in each of the multiple cooling branches.

9. The two-phase liquid cooling cabinet of claim 7, wherein the impedance device comprises multiple ball valves, each of the multiple ball valves is installed in one of the multiple cooling branches to increase the impedance in each of the multiple cooling branches.

10. The two-phase liquid cooling cabinet of claim 7, further comprising:

a cooling liquid supply device comprising a radiator, a cooling liquid reservoir, a cooling liquid pump, and a pipeline; the radiator, the cooling liquid reservoir, and the cooling liquid pump are connected in sequence by the pipeline.

11. The two-phase liquid cooling cabinet of claim 10, wherein each of the multiple electronic devices comprise more than one heat generating element, and each of the multiple cooling branches comprises more than one heat dissipation plate, the heat dissipation plates are attached on the heat generating elements respectively, and the cooling liquid in the cooling branches exchanges heat with the heat generating elements via the heat dissipation plates.

12. A method for liquid cooling of multiple electronic devices with different thermal loads, comprising:

measuring impedance of cooling fluid in multiple cooling branches of the electronic devices to obtain a highest impedance value, wherein each of the multiple electronic devices is arranged in one cooling branch; and adding additional impedance to each of the multiple cooling branches, wherein an impedance value of the additional impedance is 1-2 times of the highest impedance value;

wherein the additional impedance is set through multiple capillary tubes, each the multiple cooling branches is provided with one of the multiple capillary tubes, and the additional impedance of each of the multiple cooling branches is increased by setting the each of the multiple capillary tubes with a predetermined length.

13. The method for liquid cooling of multiple electronic devices with different thermal loads of claim 12, wherein the additional impedance is set through multiple ball valves, each of the multiple cooling branches is provided with one of the multiple ball valves, and the additional impedance of each of the multiple cooling branches is adjusted by controlling opening of each of the multiple ball valves.

* * * * *